(12) United States Patent
Lee et al.

(10) Patent No.: US 9,950,921 B2
(45) Date of Patent: Apr. 24, 2018

(54) MEMS STRUCTURE WITH IMPROVED SHIELDING AND METHOD

(71) Applicant: mCube Inc., San Jose, CA (US)

(72) Inventors: Te-Hsi "Terrence" Lee, San Jose, CA (US); Sudheer S. Sridharamurthy, Menlo Park, CA (US); Shingo Yoneoka, San Jose, CA (US); Wenhua Zhang, San Jose, CA (US)

(73) Assignee: mCube Inc., San Jose, CA (US)

( * ) Notice: Subject to any disclaimer, the term of this patent is extended or adjusted under 35 U.S.C. 154(b) by 0 days.

(21) Appl. No.: 14/930,642

(22) Filed: Nov. 2, 2015

(65) Prior Publication Data

US 2016/0052777 A1 Feb. 25, 2016

Related U.S. Application Data

(63) Continuation of application No. 14/302,385, filed on Jun. 11, 2014.

(Continued)

(51) Int. Cl.
*B81B 7/00* (2006.01)
*B81C 1/00* (2006.01)
*B81B 3/00* (2006.01)

(52) U.S. Cl.
CPC .......... *B81B 7/0022* (2013.01); *B81B 3/0086* (2013.01); *B81C 1/00246* (2013.01);
(Continued)

(58) Field of Classification Search
CPC .............. B81B 7/0022; B81C 1/00246; B81C 1/00801; B81C 1/00412; B81C 1/0042;
(Continued)

(56) References Cited

U.S. PATENT DOCUMENTS 5,736,732 A 4/1998 Possin et al.
5,825,385 A 10/1998 Silverbrook
(Continued)

FOREIGN PATENT DOCUMENTS

CN 101393321 3/2009
CN 102854998 1/2013
(Continued)

OTHER PUBLICATIONS

Office Action for U.S. Appl. No. 14/302,385 dated Apr. 20, 2015, 16 pages.
(Continued)

*Primary Examiner* — Brigitte Paterson
(74) *Attorney, Agent, or Firm* — Kilpatrick Townsend & Stockton LLP

(57) ABSTRACT

An integrated circuit includes a substrate member having a surface region and a CMOS IC layer overlying the surface region. The CMOS IC layer has at least one CMOS device. The integrated circuit also includes a bottom isolation layer overlying the CMOS IC layer, a shielding layer overlying a portion of the bottom isolation layer, and a top isolation layer overlying a portion of the bottom isolation layer. The bottom isolation layer includes an isolation region between the top isolation layer and the shielding layer. The integrated circuit also has a MEMS layer overlying the top isolation layer, the shielding layer, and the bottom isolation layer. The MEMS layer includes at least one MEMS structure having at least one movable structure and at least one anchored structure. The at least one anchored structure is coupled to a portion of the top isolation layer, and the at least one movable structure overlies the shielding layer.

16 Claims, 4 Drawing Sheets

Related U.S. Application Data

(60) Provisional application No. 61/835,510, filed on Jun. 14, 2013.

(52) U.S. Cl.
CPC ... *B81C 1/00801* (2013.01); *B81B 2203/0118* (2013.01); *B81B 2203/0307* (2013.01); *B81B 2207/11* (2013.01); *B81C 1/0038* (2013.01); *B81C 1/00531* (2013.01); *B81C 2201/053* (2013.01)

(58) Field of Classification Search
CPC ............ B81C 1/00428; B81C 1/00436; B81C 1/00777; B81C 1/00785; B81C 1/00793; B81C 1/00809; B81C 1/00817; B81C 1/00825; B81C 1/00833
See application file for complete search history.

(56) References Cited

U.S. PATENT DOCUMENTS

| | | |
|---|---|---|
| 7,595,209 B1 | 9/2009 | Monadgemi et al. |
| 7,745,892 B1 | 6/2010 | Ivanov et al. |
| 8,164,171 B2 | 4/2012 | Lin et al. |
| 8,205,498 B2 | 6/2012 | Hsu et al. |
| 8,516,886 B2 | 8/2013 | Acar et al. |
| 8,878,312 B2 | 11/2014 | Hung et al. |
| 9,075,079 B2 | 7/2015 | Yoneoka et al. |
| 9,276,080 B2 | 3/2016 | Sridharamurthy et al. |
| 2003/0196490 A1 | 10/2003 | Cardarelli |
| 2004/0121564 A1 | 6/2004 | Gogoi |
| 2005/0249966 A1 | 11/2005 | Tung et al. |
| 2008/0116534 A1 | 5/2008 | Grosjean et al. |
| 2008/0265295 A1 | 10/2008 | Brady et al. |
| 2009/0309203 A1 | 12/2009 | Seppala et al. |
| 2010/0044808 A1 | 2/2010 | Dekker et al. |
| 2010/0071467 A1 | 3/2010 | Nasiri et al. |
| 2010/0237738 A1 | 9/2010 | Smith et al. |
| 2011/0030473 A1 | 2/2011 | Acar |
| 2011/0031565 A1 | 2/2011 | Marx et al. |
| 2011/0121416 A1 | 5/2011 | Quevy et al. |
| 2011/0133256 A1 | 6/2011 | Chiu et al. |
| 2011/0265574 A1 | 11/2011 | Yang |
| 2011/0291644 A1 | 12/2011 | Kanemotoi |
| 2012/0012970 A1 | 1/2012 | Xu et al. |
| 2012/0098136 A1 | 4/2012 | Lindgren et al. |
| 2012/0223726 A1 | 9/2012 | Zhang et al. |
| 2012/0248615 A1 | 10/2012 | Chien et al. |
| 2012/0326248 A1 | 12/2012 | Daneman et al. |
| 2013/0042686 A1 | 2/2013 | Lin et al. |
| 2013/0082338 A1 | 4/2013 | Pan et al. |
| 2013/0140155 A1 | 6/2013 | Urvas et al. |
| 2013/0236988 A1 | 9/2013 | Sridharamurthy et al. |
| 2013/0247662 A1 | 9/2013 | Jin et al. |
| 2013/0247666 A1 | 9/2013 | Acar |
| 2013/0299925 A1 | 11/2013 | Classen et al. |
| 2013/0328139 A1 | 12/2013 | Acar |
| 2014/0311242 A1 | 10/2014 | Lee et al. |
| 2014/0311247 A1 | 10/2014 | Zhang et al. |
| 2014/0361348 A1 | 12/2014 | Yoneoka et al. |
| 2014/0370638 A1 | 12/2014 | Lee et al. |
| 2015/0111332 A1 | 4/2015 | Lee |
| 2015/0166330 A1 | 6/2015 | Lee |

FOREIGN PATENT DOCUMENTS

| | | |
|---|---|---|
| CN | 103303859 | 9/2013 |
| EP | 2135840 | 12/2009 |
| EP | 2811260 | 12/2014 |
| TW | 201020548 | 6/2010 |
| TW | 201110274 | 3/2011 |
| TW | 201117349 | 5/2011 |
| TW | 201213764 | 4/2012 |
| TW | 201229516 | 6/2012 |
| TW | 201238032 | 9/2012 |
| TW | 201435306 | 9/2014 |
| TW | 201435307 | 9/2014 |
| TW | 201504134 | 2/2015 |
| WO | WO2010092399 A2 | 8/2010 |
| WO | 2012037539 | 5/2012 |

OTHER PUBLICATIONS

U.S. Appl. No. 13/788,503, Advisory Action dated May 29, 2015, 3 pages.
U.S. Appl. No. 13/788,503, Final Office Action dated Mar. 11, 2015, 11 pages.
U.S. Appl. No. 13/788,503, Non-Final Office Action dated Jun. 24, 2015, 14 pages.
U.S. Appl. No. 13/788,503, Non-Final Office Action dated Oct. 3, 2014, 9 pages.
U.S. Appl. No. 13/788,503, Notice of Allowance dated Sep. 25, 2015, 12 pages.
U.S. Appl. No. 13/788,503, Restriction Requirement dated Jul. 17, 2014, 7 pages.
U.S. Appl. No. 14/297,337, Notice of Allowance dated Feb. 4, 2015, 13 pages.
U.S. Appl. No. 14/302,385, Advisory Action dated Aug. 24, 2016, 3 pages.
U.S. Appl. No. 14/302,385, Advisory Action dated Aug. 8, 2016, 4 pages.
U.S. Appl. No. 14/302,385, Final Office Action dated Apr. 27, 2016, 15 pages.
U.S. Appl. No. 14/302,385, Final Office Action dated Sep. 4, 2015, 18 pages.
U.S. Appl. No. 14/302,385, Non-Final Office Action dated Dec. 4, 2015, 15 pages.
U.S. Appl. No. 14/302,385, Restriction Requirement dated Sep. 15, 2016, 9 pages.
U.S. Appl. No. 14/521,441, Non-Final Office Action dated Apr. 28, 2015, 9 pages.
U.S. Appl. No. 14/521,441, Notice of Allowance dated Sep. 21, 2015, 7 pages.
Chinese Patent Application No. CN201310076476.9, Office Action dated Apr. 15, 2015, 11 pages. (English Translation is not available).
European Application No. EP14152747.3, Extended European Search Report dated Sep. 3, 2014, 11 pages.
European Application No. EP14171673.8, Extended European Search Report dated Nov. 10, 2014, 9 Pages.
Sun, Sensing and Control Electronics Design for Capacitive Cmos-Mems Inertial Sensors, A Dissertation Presented to the Graduate School of the University of Florida in Partial Fulfillment of the Requirements for the Degree of Doctor of Philosophy, 2002.
Tatar et al., Quadrature-Error Compensation and Corresponding Effects on the Performance of Fully Decoupled MEMS Gyroscopes, Journal of Microelectromechanical Systems, vol. 21, Jun. 2012, pp. 656-667.
Xie, Gyroscope and Micro mirror Design Using Vertical-Axis CMOS-MEMS Actuation and Sensing, Dissertation Carnegie Institute of Technology, 2002, 246 pages.
U.S. Appl. No. 14/302,385, Non-Final Office Action dated Oct. 31, 2016, 10 pages.
U.S. Appl. No. 14/302,385, Final Office Action dated Apr. 19, 2017, 9 pages.
U.S. Appl. No. 14/302,385, Advisory Action dated Aug. 3, 2017, 6 pages.
U.S. Appl. No. 14/302,385, Non-Final Office Action dated Sep. 11, 2017, 9 pages.
Taiwan Patent Application No. 103120608, Notice of Allowance dated Dec. 16, 2016, 3 pages. (English Translation is not available.)

MEMS STRUCTURE WITH IMPROVED SHIELDING AND METHOD

CROSS-REFERENCES TO RELATED APPLICATIONS

The present application is a continuation application of U.S. patent application Ser. No. 14/302,385, filed Jun. 11, 2014, which claims priority to U.S. Provisional App. No. 61/835,510, filed Jun. 14, 2013, the content of both of which is incorporated by reference herein for all purposes. The present application also incorporates by reference, for all purposes, U.S. patent application Ser. No. 13/788,503, filed Mar. 7, 2013.

BACKGROUND OF THE INVENTION

The present invention is directed to MEMS (Micro-Electro-Mechanical-Systems). More specifically, embodiments of the invention provide methods and structure for improving MEMS devices, including inertial sensors and the like. Merely by way of example, the MEMS device can include at least an accelerometer, a gyroscope, a magnetic sensor, a pressure sensor, a microphone, a humidity sensor, a temperature sensor, a chemical sensor, a biosensor, an inertial sensor, and others. But it will be recognized that the invention has a much broader range of applicability.

Research and development in integrated microelectronics have continued to produce astounding progress in CMOS and MEMS. CMOS technology has become the predominant fabrication technology for integrated circuits (IC). MEMS, however, continues to rely upon conventional process technologies. In layman's terms, microelectronic ICs are the "brains" of an integrated device which provides decision-making capabilities, whereas MEMS are the "eyes" and "arms" that provide the ability to sense and control the environment. Some examples of the widespread application of these technologies are the switches in radio frequency (RF) antenna systems, such as those in the iPhone™ device by Apple, Inc. of Cupertino, Calif., and the Blackberry™ phone by Research In Motion Limited of Waterloo, Ontario, Canada, and accelerometers in sensor-equipped game devices, such as those in the Wii™ controller manufactured by Nintendo Company Limited of Japan. Though they are not always easily identifiable, these technologies are becoming ever more prevalent in society every day.

Beyond consumer electronics, use of IC and MEMS has limitless applications through modular measurement devices such as accelerometers, gyroscopes, actuators, and sensors. In conventional vehicles, accelerometers and gyroscopes are used to deploy airbags and trigger dynamic stability control functions, respectively. MEMS gyroscopes can also be used for image stabilization systems in video and still cameras, and automatic steering systems in airplanes and torpedoes. Biological MEMS (Bio-MEMS) implement biosensors and chemical sensors for Lab-On-Chip applications, which integrate one or more laboratory functions on a single millimeter-sized chip only. Other applications include Internet and telephone networks, security and financial applications, and health care and medical systems. As described previously, ICs and MEMS can be used to practically engage in various type of environmental interaction.

Although highly successful, ICs and in particular MEMS still have limitations. Similar to IC development, MEMS development, which focuses on increasing performance, reducing size, and decreasing cost, continues to be challenging. Additionally, applications of MEMS often require increasingly complex microsystems that desire greater computational power. Unfortunately, such applications generally do not exist. These and other limitations of conventional MEMS and ICs may be further described throughout the present specification and more particularly below.

From the above, it is seen that techniques for improving MEMS structures are highly desired.

BRIEF SUMMARY OF THE INVENTION

The present invention is directed to MEMS (Micro-Electro-Mechanical-Systems). More specifically, embodiments of the invention provide methods and structure for improving MEMS devices, including inertial sensors and the like. Merely by way of example, the MEMS device can include at least an accelerometer, a gyroscope, a gyrometer, a magnetic field sensor, a pressure sensor, a microphone, a humidity sensor, a temperature sensor, a chemical sensor, a biosensor, an inertial sensor, and others. But it will be recognized that the invention has a much broader range of applicability.

In an embodiment, the present method uses a microfabrication process that realizes moving mechanical structures (MEMS) on top of a conventional CMOS structure by bonding a mechanical structural wafer on top of the CMOS and etching the mechanical layer using plasma etching processes, such as Deep Reactive Ion Etching (DRIE). During etching of the mechanical layer, CMOS devices that are directly connected to the mechanical layer are exposed to plasma. This sometimes causes permanent damage to CMOS circuits and is termed Plasma Induced Damage (PID). An object of the present invention is to prevent or reduce this PID and protect the underlying CMOS circuits by grounding and providing an alternate path for the CMOS circuits until the MEMS layer is completely etched.

In an embodiment, the present invention can include a method for fabricating an integrated MEMS-CMOS device. The method can include providing a substrate member having a surface region and forming a CMOS IC layer having at least one CMOS device overlying the surface region. A bottom isolation layer can be formed overlying the CMOS IC layer and a shielding layer and a top isolation layer can be formed overlying a portion of bottom isolation layer. The bottom isolation layer can include an isolation region between the top isolation layer and the shielding layer. A MEMS layer overlying the top isolation layer, the shielding layer, and the bottom isolation layer, and can be etched to form at least one MEMS structure having at least one movable structure and at least one anchored structure, wherein the at least one anchored structure is coupled to a portion of the top isolation layer, wherein the at least one movable structure is formed overlying the shielding layer.

Many benefits are achieved by way of embodiments of the present invention over conventional techniques. For example, embodiments of the present technique provide an easy to use process to integrated MEMS and CMOS circuits on a single die. In some embodiments, the method provides a fabrication process that protects exposed CMOS ICs from PID, leakage path, and other damage issues. Additionally, the method provides a process and system that are compatible with conventional semiconductor and MEMS process technologies without substantial modifications to conventional equipment and processes. Depending upon the embodiment, one or more of these benefits may be achieved. These and other benefits will be described in more detail throughout the present specification and more particularly below.

Various additional objects, features and advantages of the present invention can be more fully appreciated with reference to the detailed description and accompanying drawings that follow.

BRIEF DESCRIPTION OF THE DRAWINGS

In order to more fully understand the present invention, reference is made to the accompanying drawings. Understanding that these drawings are not to be considered limitations in the scope of the invention, the presently described embodiments and the presently understood best mode of the invention are described with additional detail through use of the accompanying drawings in which.

DETAILED DESCRIPTION OF THE INVENTION

The present invention is directed to MEMS (Micro-Electro-Mechanical-Systems). More specifically, embodiments of the invention provide methods and structure for improving integrated MEMS devices, including inertial sensors and the like. Merely by way of example, the MEMS device can include at least an accelerometer, a gyroscope, a magnetic sensor, a pressure sensor, a microphone, a humidity sensor, a temperature sensor, a chemical sensor, a biosensor, an inertial sensor, and others. But it will be recognized that the invention has a much broader range of applicability.

FIGS. 1-4 use the numerals listed in the following table:

| | |
|---|---|
| 1 | Movable structure layer (e.g. Si, poly-Si) |
| 2 | Anchored structure layer (e.g. Si, poly-Si) |
| 3 | Bottom isolation layer (e.g. SiO2, Si3N4) |
| 4 | Top isolation layer (e.g. SiO2, Si3N4) |
| 5 | Bottom edges of structure layer |
| 6 | Sidewalls of top isolation layer |
| 7 | Shielding layer (e.g. Al, poly-Si) |
| 8 | Edge of the shielding layer |
| 3a | Exposed bottom isolation layer |
| 3b | Isolative path of Embodiment 1 |
| 3c | Isolative path of Embodiment 2 |
| 7a | Exposed shielding layer |

Figure 1:
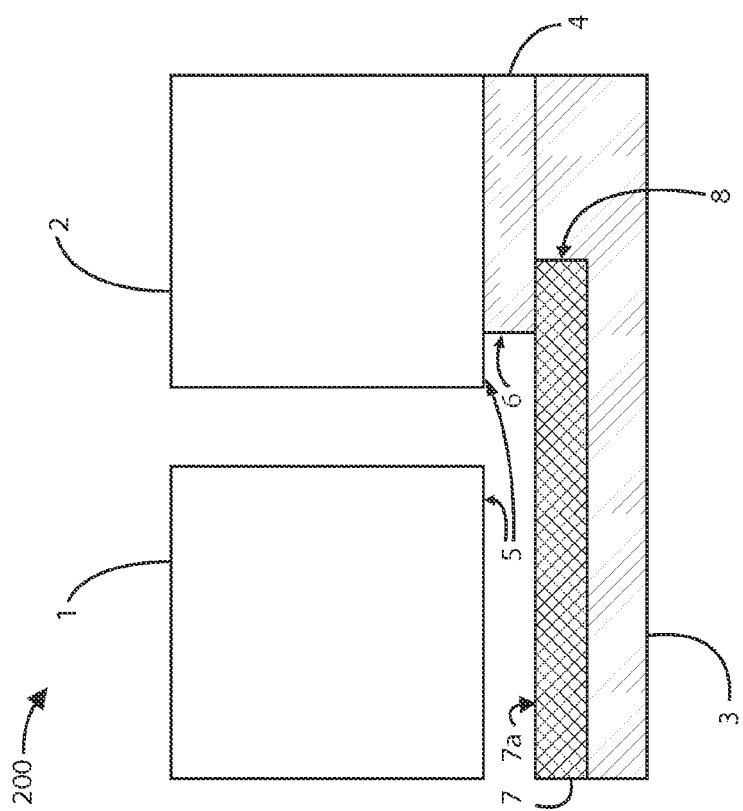
FIG. 1 is a diagram illustrating a side view of a conventional embodiment of a MEMS structure without shielding.

FIG. 1 is a diagram illustrating a side view of a conventional embodiment of a MEMS structure without shielding. As shown, a MEMS structure 100 having a movable structure layer 1 and an anchored structure layer 2 disposed overlying a bottom isolation layer 3. The anchored structure layer 2 is coupled to top isolation layer 4, which is also coupled to the bottom isolation layer 3. For reference, the exposed portion of the bottom isolation layer 3a, the bottom edges 5 of the structure layers 1 and 2, and the side walls 6 of the top isolation layer 4 are shown. This configuration results in structural damage at the bottom edges 5 due to back-etching induced by accumulated charging at the exposed bottom isolation layer 3a during an over-etching stage of the structure layers 1 and 2.

Figure 2:
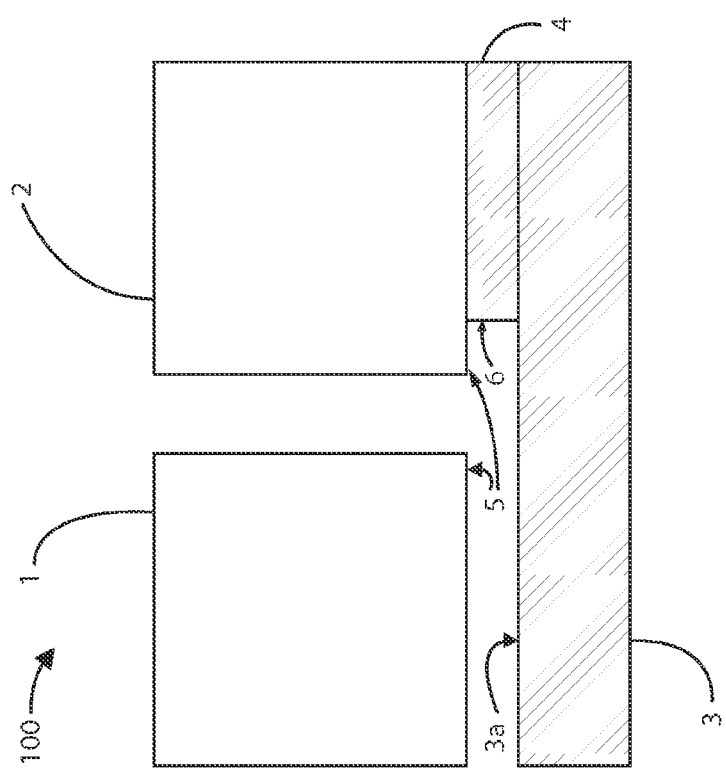
FIG. 2 is a diagram illustrating a side view of a MEMS structure with full shielding according to an embodiment of the present invention.

FIG. 2 is a diagram illustrating a side view of a MEMS structure with full shielding according to an embodiment of the present invention. Compared to MEMS structure 100, MEMS structure 200 additionally has a shielding layer 7, which is grounded, to prevent the charging at the exposed bottom layer. However, this configuration results in a leakage path at the sidewalls 6 of the top isolation layer 4 between the anchored structure layer 2 and the shielding layer 7. The leakage path is due to the back-sputtering induced by plasma bombardments at the exposed shielding layer 7a during an over-etching stage of the structure layers 1 and 2, which deposits conductive shielding materials at adjacent sidewalls 6 of the top isolation layer 4 and bottoms of the structure layers 1 and 2. As an example, some residue of a plasma etching process can splash up on sidewalls 6 and can intermittently cause a short in the region between structure layer 2 and the shielding layer 7.

Figure 3:
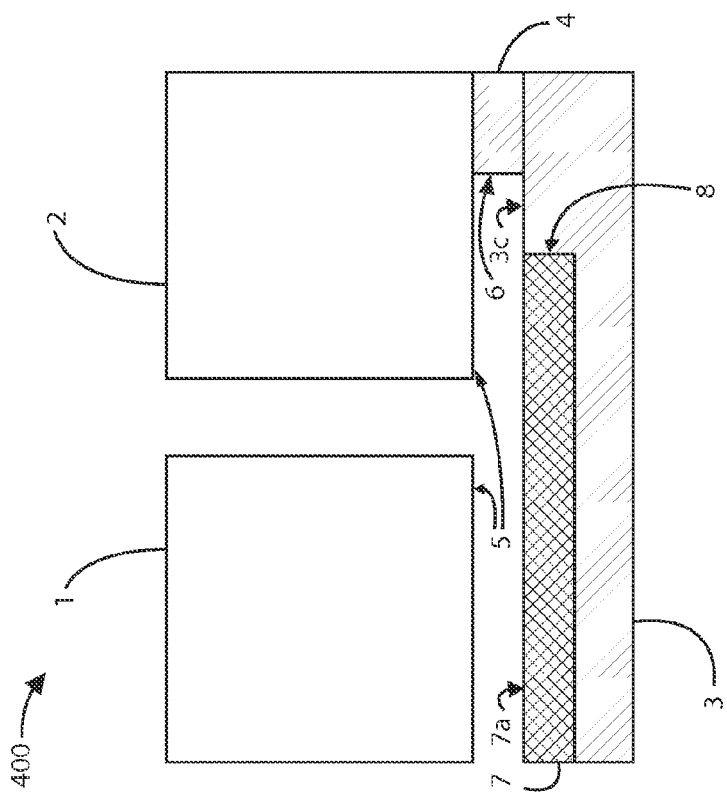
FIG. 3 is a simplified diagram illustrating a side view of a MEMS structure with single-sided partial shielding according to an embodiment of the present invention.

FIG. 3 is a simplified diagram illustrating a side view of a MEMS structure with single-sided partial shielding according to an embodiment of the present invention. In this embodiment, the shielding layer 7 is configured such that it does not reach the sidewall 6 of the top isolation layer. This configuration provides protection from charging and provides an isolative path (3b) between the edges 8 of the shielding 7 and the sidewalls 6 of the top isolation layer 4. This isolation path provides isolation without back-sputtered materials. As an example, plasma will still short to the shielding 7 and region 3b still be protected from plasma damage. By reducing the shielding layer 7, no residue will be splashed onto sidewall 6.

Figure 4:
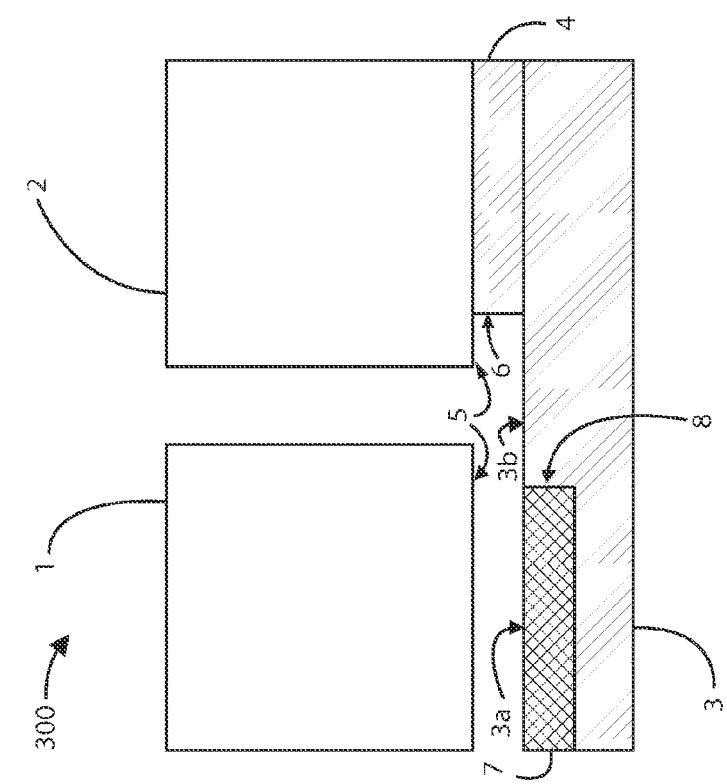
FIG. 4 is a simplified diagram illustrating a side view of a MEMS structure with full shielding and retrograde isolation according to an embodiment of the present invention.

FIG. 4 is a simplified diagram illustrating a side view of a MEMS structure with full shielding and retrograde isolation according to an embodiment of the present invention. This embodiment uses shielding layer 7 similar to that shown in FIG. 2, however, the top isolation layer is cut back, through an etching process or the like. As an example, plasma residue and/or other materials will not stick to the sidewall 6, and the MEMS device will not intermittently short out.

Figure 5:
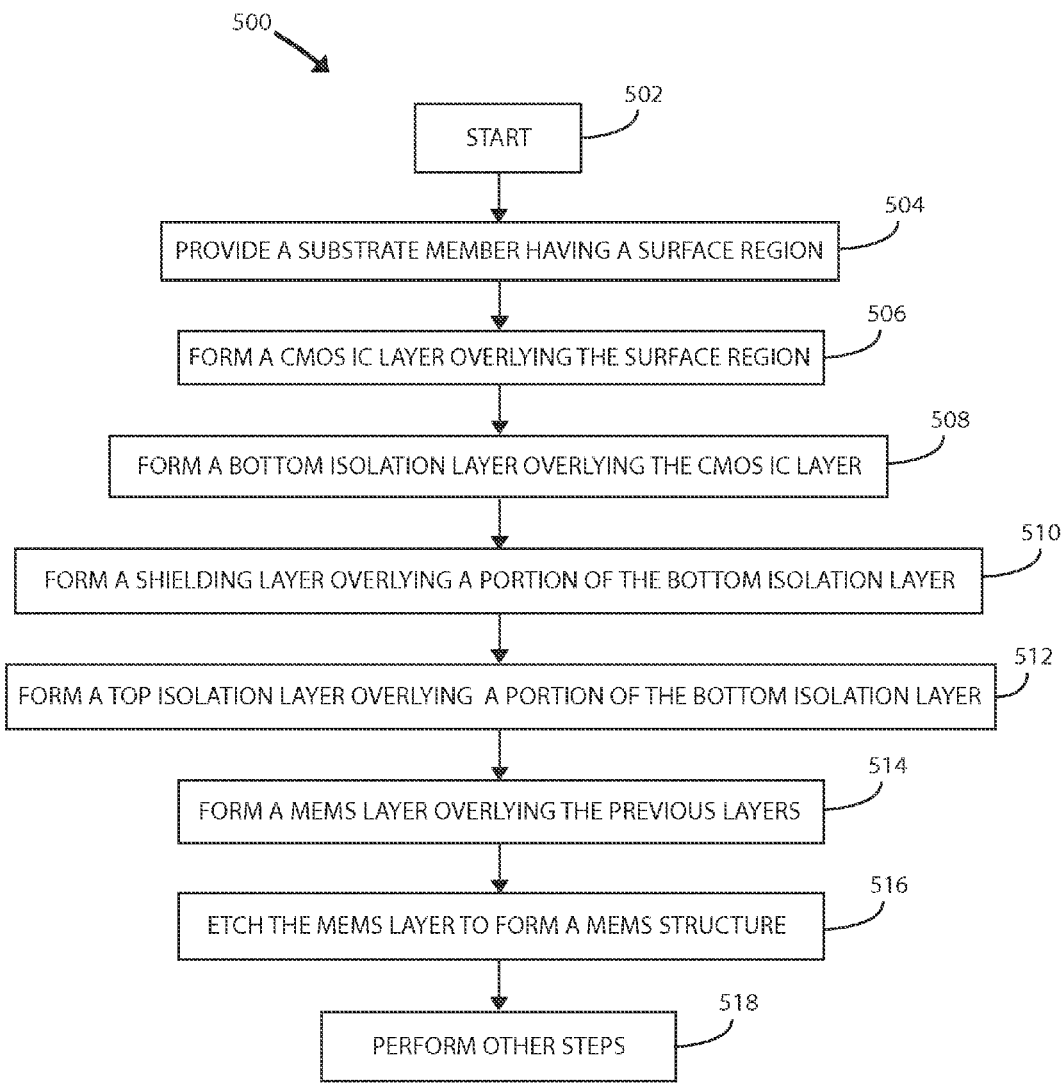
FIG. 5 is a simplified flow diagram illustrating a method for fabricating a MEMS structure with full shielding and retrograde isolation according to an embodiment of the present invention.

FIG. 5 is a simplified flow diagram illustrating a method for fabricating a MEMS structure with full shielding and retrograde isolation according to an embodiment of the present invention. Referring to FIG. 5, an example of a manufacturing process 500 can be briefly described below:
  1. Start; (step 502)
  2. Provide a substrate member having a surface region; (step 504)
  3. Form a CMOS IC layer overlying the surface region, the CMOS IC layer having at least one CMOS device; (step 506)
  4. Form a bottom isolation layer overlying the CMOS IC layer; step (508)
  5. Form a shielding layer overlying a portion of the bottom isolation layer; (step 510)
  6. Form a top isolation layer overlying a portion of the bottom isolation layer, wherein the bottom isolation layer includes an isolation region between the top isolation layer and the shielding layer; (step 512)

7. Form a MEMS layer overlying the top isolation layer, the shielding layer, and the bottom isolation layer; (step 514)

8. Etch the MEMS layer to form at least one MEMS structure having at least one movable structure and at least one anchored structure, wherein the at least one anchored structure is coupled to a portion of the top isolation layer, wherein the at least one movable structure is formed overlying the shielding layer; (step 516) and 9. Perform other steps, as desired. (step 518)

The aforementioned steps are provided for the formation of an integrated MEMS-CMOS device using an improved shielding configuration. Of course, depending upon the embodiment, steps or a step can be added, removed, combined, reordered, or replaced, or has other variations, alternatives, and modifications. Further details of the present manufacturing process can be found throughout the present specification, and more particularly below.

As shown in FIG. 5, the method begins with providing a substrate member having a surface region. This substrate member can include silicon materials, such as single crystal and polycrystalline silicon. The method can include forming a CMOS IC layer overlying the surface region, with the CMOS IC layer having at least one CMOS device. A bottom isolation layer can be formed overlying the CMOS IC layer and a shielding layer can be formed overlying a portion of the bottom isolation layer. In a specific embodiment, the shielding layer can be formed within a portion of the bottom isolation layer.

In an embodiment, the method can include forming a top isolation layer overlying a portion of the bottom isolation layer. The bottom isolation layer can include an isolation region configured between the top isolation layer and the shielding layer. In an embodiment, the isolation region is an exposed portion of the bottom isolation layer free from contact with the top isolation layer and the shielding layer. A MEMS layer can be formed overlying the top isolation layer, the shielding layer, and the bottom isolation layer.

The MEMS layer can be etched to form at least one MEMS structure having at least one movable structure and at least one anchored structure. In a specific embodiment, the etching process can include a plasma etching, a deep reactive-ion etching (DRIE), or other like process. The at least one anchored structure can be coupled to a portion of the top isolation layer and the at least one movable structure is formed overlying the shielding layer. This MEMS structure can include an accelerometer, a gyrometer, a magnetometer, a pressure sensor, or the like.

In a specific embodiment, the shielding layer can include a polysilicon, aluminum, or other like materials. The movable structure and anchored structure layers can include silicon, polysilicon, or other like materials. The top and bottom isolation layers can include silicon dioxide, silicon nitride, or other like materials. The shielding layer can include aluminum, polysilicon, or other like materials. Those of ordinary skill in the art will recognize other variations, modifications, and alternatives.

In a specific embodiment, the shielding layer can include a shielding layer having a single sided partial shielding layer underlying at least a portion of the movable structure. This configuration is similar to the embodiment shown in FIG. 3.

In a specific embodiment, the shielding layer can include a full shielding layer underlying at least a portion of the movable structure and at least a portion of the anchored structure. In this embodiment, the method can further include etching the top isolation layer to form the isolation region between the top isolation layer and the bottom isolation layer. This configuration is similar to the embodiment shown in FIG. 4.

Many benefits are achieved by way of embodiments of the present invention over conventional techniques. For example, embodiments of the present technique provide an easy to use process to integrated MEMS and CMOS circuits on a single die. In some embodiments, the method provides a fabrication process that protects exposed CMOS ICs from PID, leakage path, and other damage issues. Additionally, the method provides a process and system that are compatible with conventional semiconductor and MEMS process technologies without substantial modifications to conventional equipment and processes. Depending upon the embodiment, one or more of these benefits may be achieved.

Figure 6:
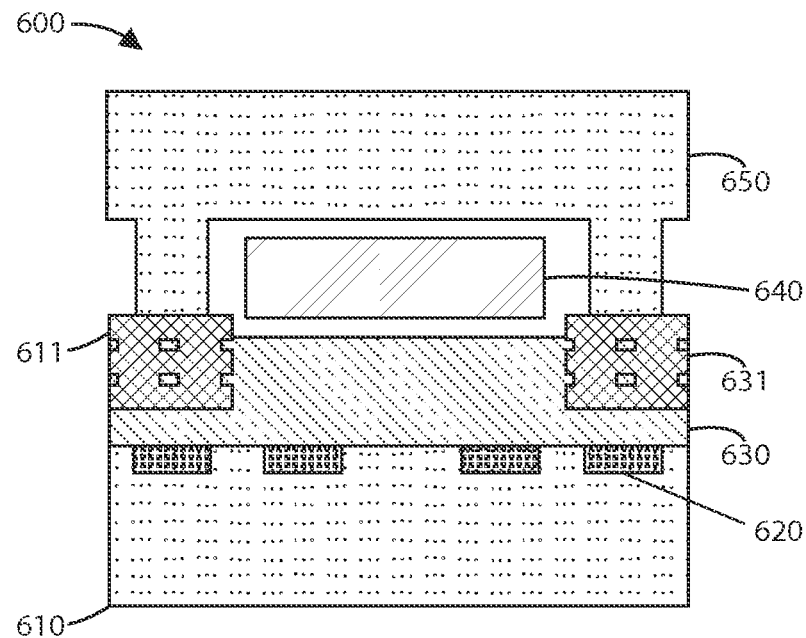
FIG. 6 is a simplified diagram illustrating a cross-sectional view of an integrated MEMS-CMOS device according to an embodiment of the present invention.

FIG. 6 is a simplified diagram illustrating a cross-sectional view of an integrated MEMS-CMOS device according to an embodiment of the present invention. This device 600 includes a fully processed CMOS substrate 610 with CMOS circuits 620. An oxide layer 630 and a MEMS structure 640 overly the CMOS substrate 610. A cap structure 650 encapsulates the MEMS structure 640. The region where the cap structure 650 meets the oxide layer 630 is configured with metal stress buffers 631. Here, a metal stress buffer 631 is provided underlying the contact regions of the cap. This arrangement has the advantages of reducing the risk of stress-induced oxide crack and circuit damages.

It is also understood that the examples and embodiments described herein are for illustrative purposes only and that various modifications or changes in light thereof will be suggested to persons skilled in the art and are to be included within the spirit and purview of this application and scope of the appended claims.

What is claimed is:

1. An integrated circuit comprising:
    a substrate member having a surface region;
    a CMOS IC layer overlying the surface region, the CMOS IC layer having a plurality of CMOS integrated circuits;
    a bottom isolation layer made entirely of a first dielectric material overlying the CMOS IC layer;
    a conductive shielding layer overlying a portion of the bottom isolation layer;
    a top isolation layer made entirely of a second dielectric material disposed directly on a portion of the bottom isolation layer, wherein the bottom isolation layer comprises an isolation region between the top isolation layer and the conductive shielding layer, the isolation region extending to a sidewall of the top isolation region such that no conductive layer is adjacent to the sidewall of the top isolation region; and
    a MEMS layer overlying the top isolation layer, the shielding layer, and the bottom isolation layer,
    the MEMS layer including at least one MEMS structure having at least one movable structure and at least one anchored structure, the at least one movable structure being separated from the at least one anchored structure, wherein the at least one anchored structure is coupled to a portion of the top isolation layer, wherein the at least one movable structure overlies the shielding layer.

2. The integrated circuit of claim 1 wherein the shielding layer is disposed within a portion of the bottom isolation layer.

3. The integrated circuit of claim 1 wherein the shielding layer comprises a single-sided partial shielding layer underlying at least a portion of the movable structure.

4. The integrated circuit of claim 1 wherein the shielding layer comprises a full shielding layer underlying at least a portion of the movable structure and at least a portion of the anchored structure.

5. The integrated circuit of claim 4 wherein the isolation region is configured to separate the top isolation layer from the shielding layer.

6. The integrated circuit of claim 1 wherein the shielding layer comprises a polysilicon material or an aluminum material.

7. The integrated circuit of claim 1 wherein the shielding layer is underneath a gap between the at least one movable structure and at least one anchored structure.

8. The integrated circuit of claim 1 wherein the at least one MEMS structure comprises an accelerometer, a gyrometer, a magnetometer, or a pressure sensor.

9. An integrated circuit comprising: a substrate member having a surface region; a CMOS IC layer overlying the surface region, the CMOS IC layer having a plurality of CMOS integrated circuits; a bottom isolation layer made entirely of a first dielectric material overlying the CMOS IC layer; a shielding layer overlying a portion of the bottom isolation layer; a top isolation layer made entirely of a second dielectric material disposed directly on a portion of the bottom isolation layer, wherein the bottom isolation layer comprises an isolation region between the top isolation layer and the shielding layer, the isolation region being an exposed portion of the bottom isolation layer free from conductive contact with sidewall of the top isolation layer and the shielding layer; and a MEMS layer overlying the top isolation layer, the shielding layer, and the bottom isolation layer, the MEMS layer including at least one MEMS structure having at least one movable structure and at least one anchored structure, wherein the at least one anchored structure is coupled to a portion of the top isolation layer, wherein the at least one movable structure is separate from the at least one anchored structure and overlies the shielding layer.

10. The integrated circuit of claim 9 wherein the shielding layer is formed within a portion of the bottom isolation layer.

11. The integrated circuit of claim 9 wherein the shielding layer comprises a single-sided partial shielding layer underlying at least a portion of the movable structure.

12. The integrated circuit of claim 9 wherein the shielding layer comprises a full shielding layer underlying at least a portion of the movable structure and at least a portion of the anchored structure.

13. The integrated circuit of claim 12 wherein the isolation region is configured to separate the top isolation layer from the shielding layer.

14. The integrated circuit of claim 9 wherein the shielding layer comprises a polysilicon material or an aluminum material.

15. The integrated circuit of claim 9 wherein the shielding layer is underneath a gap between the at least one movable structure and at least one anchored structure.

16. The integrated circuit of claim 9 wherein the at least one MEMS structure comprises an accelerometer, a gyrometer, a magnetometer, or a pressure sensor.

* * * * *